United States Patent
Melsert et al.

(10) Patent No.: US 11,316,089 B2
(45) Date of Patent: *Apr. 26, 2022

(54) THERMOELECTRIC POWER GENERATION AND MINERAL EXTRACTION FROM BRINES

(71) Applicant: SOUTHERN RESEARCH INSTITUTE, Birmingham, AL (US)

(72) Inventors: Ryan Melsert, Reno, NV (US); Jay Renew, Kennesaw, GA (US)

(73) Assignee: Southern Research Institute, Birmingham, AL (US)

(*) Notice: Subject to any disclaimer, the term of this patent is extended or adjusted under 35 U.S.C. 154(b) by 68 days.

This patent is subject to a terminal disclaimer.

(21) Appl. No.: 16/876,210

(22) Filed: May 18, 2020

(65) Prior Publication Data
US 2020/0279987 A1 Sep. 3, 2020

Related U.S. Application Data

(63) Continuation of application No. 15/982,374, filed on May 17, 2018, now Pat. No. 10,686,110, which is a
(Continued)

(51) Int. Cl.
*B01D 69/02* (2006.01)
*B01D 71/02* (2006.01)
(Continued)

(52) U.S. Cl.
CPC ............. *H01L 35/00* (2013.01); *B01D 15/12* (2013.01); *B01D 21/00* (2013.01); *B01D 61/362* (2013.01); *B01D 61/366* (2013.01); *B01D 61/58* (2013.01); *B01D 69/02* (2013.01); *B01D 71/02* (2013.01); *B01D 71/06* (2013.01); *C01D 15/00* (2013.01);

*C01D 15/08* (2013.01); *C01F 5/00* (2013.01); *C02F 1/281* (2013.01); *C02F 1/448* (2013.01); *C02F 1/52* (2013.01); *B01D 2325/38* (2013.01);
(Continued)

(58) Field of Classification Search
CPC .... B01D 61/36; B01D 61/362; B01D 61/364; B01D 61/366; C02F 2303/10; H01L 35/00

See application file for complete search history.

(56) References Cited

U.S. PATENT DOCUMENTS

597,521 A 1/1898 Frossard et al.
8,597,521 B1 12/2013 Harrison
(Continued)

FOREIGN PATENT DOCUMENTS

FR 1318427 A 2/1963

OTHER PUBLICATIONS

Chitrakar, R., et al., "Recovery of Lithium from Seawater Using Manganese Oxide Adsorbent (H1.6Mn1.6O4) Derived from Li1.6Mn1.6O4." Industrial & Engineering Chemical Research 40: 2054-2058 (2001).
(Continued)

*Primary Examiner* — Bradley R Spies
(74) *Attorney, Agent, or Firm* — Ballard Spahr LLP (57) ABSTRACT

Disclosed herein is a method and apparatus that uses a brine from a well that is used to both generate electricity and recover valuable minerals present in the brine. The method and apparatus uses a hydrophobic membrane to separate water vapor from the brine to concentrate the brine that is then used to recover the minerals.

16 Claims, 7 Drawing Sheets

Related U.S. Application Data continuation of application No. 15/138,554, filed on Apr. 26, 2016, now Pat. No. 10,038,131.

(60) Provisional application No. 62/220,676, filed on Sep. 18, 2015.

(51) Int. Cl.

| | | |
|---|---|---|
| *B01D 71/06* | (2006.01) | |
| *C02F 1/44* | (2006.01) | |
| *C02F 101/10* | (2006.01) | |
| *C02F 103/34* | (2006.01) | |
| *H01L 35/00* | (2006.01) | |
| *B01D 15/12* | (2006.01) | |
| *B01D 21/00* | (2006.01) | |
| *B01D 61/36* | (2006.01) | |
| *B01D 61/58* | (2006.01) | |
| *C01D 15/00* | (2006.01) | |
| *C01D 15/08* | (2006.01) | |
| *C02F 1/28* | (2006.01) | |
| *C02F 1/52* | (2006.01) | |
| *C01F 5/00* | (2006.01) | |

(52) U.S. Cl.
CPC ...... *C02F 2101/10* (2013.01); *C02F 2103/34* (2013.01); *C02F 2303/10* (2013.01); *Y02P 20/133* (2015.11)

(56) References Cited

U.S. PATENT DOCUMENTS

| | | |
|---|---|---|
| 8,753,594 B1 | 6/2014 | Burba, III et al. |
| 9,034,294 B1 | 5/2015 | Harrison |
| 10,038,131 B2 | 7/2018 | Melsert et al. |
| 2010/0170776 A1 | 7/2010 | Ehrenberg et al. |
| 2011/0174739 A1 | 7/2011 | Chung et al. |
| 2013/0209336 A1 | 8/2013 | Harrison et al. |
| 2015/0048028 A1 | 2/2015 | Thomas et al. |
| 2017/0084812 A1 | 3/2017 | Melsert et al. |
| 2018/0269367 A1 | 9/2018 | Melsert et al. |

OTHER PUBLICATIONS

Ryabtsev, et al., "Sorption of Lithium from Brine onto Granular LiCl . 2Al(OH)3 .mH2O Sorbent under Dynamic Conditions." Russian Journal of Applied Chemistry 75(7): 1069-1074 (2002).

Thomas et al: Low Temperature Geothermal Mineral Recovery Program, Proceedings, Fortieth Workshop on Geothermal Reservoir Engineering, (2015) pp. 1-10.

International Search Report and Written Opinion was dated Jul. 5, 2016 for Application No. PCT/US2016/029350, which was filed on Apr. 26, 2016 (Inventor—Ryan Melsert) (166 pages).

International Preliminary Report on Patentability was dated Mar. 20, 2018 by the International Searching Authority for Application No. PCT/US2016/029350, which was filed on Apr. 26, 2016 and published as WO 2017/048329 on Mar. 23, 2017 (Applicant—Southern Research Institute) (10 pages) .

U.S. Appl. No. 62/220,676, filed Sep. 18, 2015, Ryan Melsert.

U.S. Appl. No. 15/138,554 (U.S. Pat. No. 10,038,131), filed Apr. 26, 2016 (Jul. 31, 2018), Ryan Melsert.

U.S. Appl. No. 15/982,374, filed May 17, 2018, Ryan Melsert.

BO, SP-0075-16, Apr. 29, 2016, Southern Research Institute.

PCT, PCT/US2016/029350 (WO 2017/048329), Apr. 26, 2016 (Mar. 23, 2017), Southern Research Institute.

THERMOELECTRIC POWER GENERATION AND MINERAL EXTRACTION FROM BRINES

CROSS-REFERENCE TO RELATED APPLICATIONS

This application is a continuation application of U.S. application Ser. No. 15/982,374, filed May 17, 2018, which is a continuation application of U.S. application Ser. No. 15/138,554, filed Apr. 26, 2016, which claims the benefit of U.S. Provisional Application No. 62/220,676, filed on Sep. 18, 2015, which are all incorporated herein by reference in their entirety.

GOVERNMENT LICENSE RIGHTS

This invention was made with government support under DE-EE0006746 awarded by the Department of Energy (DOE). The government has certain rights in the invention.

BACKGROUND

Geothermal resources provide the opportunity for low-cost renewable base-load power generation. Today, however, only high-temperature resources (brines) are able to be harvested economically. The thermal energy extracted from these high-temperature geothermal reservoirs is converted to electricity through use of conventional steam or organic Rankine power cycles. Systems based on these power cycles are very mature and efficient under high-temperature thermal inputs. However, conversion efficiency decreases substantially as resource temperature decreases. As volumetric power densities also decrease at low resource temperatures, the decreases in efficiency are accompanied by dramatic increases in power specific capital costs. Additionally, in small-scale distributed applications, turbo-machinery based systems experience further decreases in efficiency and increases in power specific capital cost.

SUMMARY

Disclosed herein is a method for generating electricity and recovering a mineral from a brine comprising the steps of:
 a) providing a first brine comprising water, silica, one or more polyvalent ions, and at least one mineral from a well, wherein the first brine has a temperature below about 150° C.;
 b) removing at least a portion of the silica from the first brine, thereby producing a second brine;
 c) removing at least a portion of the water from the second brine by passing water vapor generated from the second brine through a hydrophobic membrane, thereby producing a third brine, wherein the third brine has a higher concentration of the at least one mineral than the second brine;
 d) contacting at least a portion of the water vapor that passed through the hydrophobic membrane with a thermoelectric module, thereby generating electricity; and
 e) recovering at least a portion of the at least one mineral from the third brine.

Also disclosed herein is a method for generating electricity and recovering a mineral from a brine comprising the steps of:
 a) providing a first brine comprising water, silica, one or more polyvalent ions, and at least one mineral from a well, wherein the first brine has a temperature below about 300° C.;
 b) removing at least a portion of the water from the first brine by passing water vapor generated from the first brine through a first hydrophobic membrane, thereby producing a fourth brine, wherein the fourth brine is at least 5% more concentrated in total solids than the first brine;
 c) contacting at least a portion of the water vapor that passed through the first hydrophobic membrane with a thermoelectric module, thereby generating electricity;
 d) removing at least a portion of the silica, one or more polyvalent ions from the fourth brine, thereby producing a fifth brine;
 e) removing at least a portion of the water from the fifth brine by passing water vapor generated from the fifth brine through a second hydrophobic membrane, thereby producing a sixth brine, wherein the sixth brine has a higher concentration of the at least one mineral than the fifth brine; and
 f) recovering at least a portion of the at least one mineral from the sixth brine.

Also disclosed herein is an apparatus comprising a) a housing comprising first inlet and a first outlet, wherein the housing comprises a bottom wall and an opposed top wall, wherein the bottom wall and the top wall are spaced apart relative to a vertical axis, wherein the first inlet and the first outlet are spaced apart relative to a longitudinal axis; b) a hydrophobic membrane positioned within the housing, wherein the hydrophobic membrane is positioned between the top wall of the housing and both the first inlet and the first outlet relative to the vertical axis; and a thermoelectric module positioned within the housing, wherein the thermoelectric module is positioned between the top wall and the hydrophobic membrane relative to the vertical axis.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION OF THE FIGURES

These and other features of the preferred embodiments of the invention will become more apparent in the detailed description in which reference is made to the appended drawings wherein.

DETAILED DESCRIPTION

The present invention can be understood more readily by reference to the following detailed description, examples, drawings, and claims, and their previous and following description. However, before the present devices, systems, and/or methods are disclosed and described, it is to be understood that this invention is not limited to the specific devices, systems, and/or methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

It is also to be understood that the terminology used herein is for the purpose of describing particular aspects only and is not intended to be limiting. Although any devices and methods similar or equivalent to those described herein can be used in the practice or testing of the present invention, example methods and materials are now described.

As used in the specification and in the claims, the term "comprising" can include the aspects "consisting of" and "consisting essentially of" Unless defined otherwise, all technical and scientific terms used herein have the same meaning as commonly understood by one of ordinary skill in the art to which this invention belongs. In this specification and in the claims, which follow, reference will be made to a number of terms which shall be defined herein.

As used in the specification and the appended claims, the singular forms "a," "an" and "the" include plural referents unless the context clearly dictates otherwise. Thus, for example, reference to "a subject" includes two or more subjects.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; and the number or type of aspects described in the specification.

1. Method and Apparatus

Electricity is currently generated from high-temperature (>~300° C.) resources, such as, for example high-temperature brines, through use of the steam Rankine cycle, and from medium-temperature (>190° C.-300° C.) resources, such as, for example medium-temperature brines, through use of the organic Rankine cycle. However, low-temperature resources (<190° C.), such as, for example, a low-temperature brine, are generally not used to produce electricity. These brines contain minerals, such as, for example, lithium, cobalt, nickel, and rare earth elements. It would be desired to recover these metals.

Accordingly, there is a need in the art for methods and apparatuses that can utilize a low-temperature brine to generate electricity and to recover metal found in the brines. Such a method and apparatus are disclosed herein.

Disclosed herein are methods and apparatuses that can utilize medium-temperature and low-temperature brines to produce electricity. Furthermore, the methods and apparatuses disclosed herein can be used to also recover minerals from these medium-temperature and low-temperature brines.

In circumstances where low-temperature resources are used for power generation, binary organic Rankine cycles are conventionally used. However, such a system experience low conversion efficiencies and high power specific capital costs. Furthermore, the efficiency and specific capital costs of all of these turbo-machinery based conversion systems are highly sensitive to scale. As such, these systems have challenges being economically feasible in small distributed generation applications.

The economics of stand-alone high-value mineral extraction from geothermal brine processes are not attractive when the minerals are in low concentrations, as large volumes of brine are needed to be processed to extract minimum amounts of mineral. There is also a minimum total resource size that is needed to justify commercial extraction.

While neither power generation from medium-temperature and low-temperature brines, nor dilute mineral extraction systems or apparatuses are economically feasible on their own, it has been found herein that a combined process that leverages the strengths of each can be implemented to synergistically create an economically competitive system. Such an apparatus and method are described herein.

The apparatus and method described herein using one, or alternatively two, thermally driven membrane distillation component(s) to extract water vapor from a medium temperature and/or low-temperature brine to produce electrical power via a solid-state thermoelectric generator(s), while simultaneously concentrating the medium temperature and/or low-temperature brine to facilitate a brine suitable for high-value mineral extraction.

Two thermally driven membrane distillation component(s) are typically used with medium-temperature brines. The first thermally driven membrane distillation component(s) typically comprises a ceramic hydrophobic membrane that can withstand the temperature of the medium-temperature brine, for example, temperatures above about 190° C. The second thermally driven membrane distillation component(s) typically comprises a polymeric hydrophobic membrane that can efficiently separate water vapor from a liquid water and minerals, such as, for example, lithium. The polymeric hydrophobic membrane can be used for brines with a lower temperature, for example, temperatures below about 190° C. or below about 150° C.

The combination of power generation and mineral extraction disclosed herein can make an otherwise uneconomical process economically feasible.

The apparatus and method disclosed herein generally comprises a low-value inhibitory mineral precipitation and separation process, followed by a thermally driven membrane separation technology, which provides for the thermoelectric power generation and concentration of the brine that is used for the high-value mineral extraction.

Disclosed herein is a first method for generating electricity and recovering a mineral from a brine comprising the steps of:
   a) providing a first brine comprising water, silica, one or more polyvalent ions, and at least one mineral from a well, wherein the first brine has a temperature below about 300° C.;
   b) removing at least a portion of the silica from the first brine, thereby producing a second brine;
   c) removing at least a portion of the water from the second brine by passing water vapor generated from the second brine through a hydrophobic membrane, thereby producing a third brine, wherein the third brine has a higher concentration of the at least one mineral than the second brine;
   d) contacting at least a portion of the water vapor that passed through the hydrophobic membrane with a thermoelectric module, thereby generating electricity; and
   e) recovering at least a portion of the at least one mineral from the third brine.

Also disclosed herein is a second method for generating electricity and recovering a mineral from a brine comprising the steps of:
   a) providing a first brine comprising water, silica, one or more polyvalent ions, and at least one mineral from a well, wherein the first brine has a temperature below about 300° C.;
   b) removing at least a portion of the water from the first brine by passing water vapor generated from the first brine through a first hydrophobic membrane, thereby producing a fourth brine, wherein the fourth brine is at least 5% more concentrated in total solids than the first brine;
   c) contacting at least a portion of the water vapor that passed through the first hydrophobic membrane with a thermoelectric module, thereby generating electricity;
   d) removing at least a portion of the silica, one or more polyvalent ions from the fourth brine, thereby producing a fifth brine;
   e) removing at least a portion of the water from the fifth brine by passing water vapor generated from the fifth brine through a second hydrophobic membrane, thereby producing a sixth brine, wherein the sixth brine has a higher concentration of the at least one mineral than the fifth brine; and
   f) recovering at least a portion of the at least one mineral from the sixth brine.

In one aspect, the second method further comprises contacting at least a portion of the water vapor that was generated from the fifth brine and passing it through the second hydrophobic membrane with a thermoelectric module, thereby generating electricity.

The steps in the two methods disclosed correspond as follows: 1. step a) in the first method corresponds to step a) in the second method; 2. step b) in the first method corresponds to step d) in the second method; 3. step c) in the first method corresponds to step e) in the second method; 4. Step e) in the first method corresponds to step f) in the second method.

Figure 1:
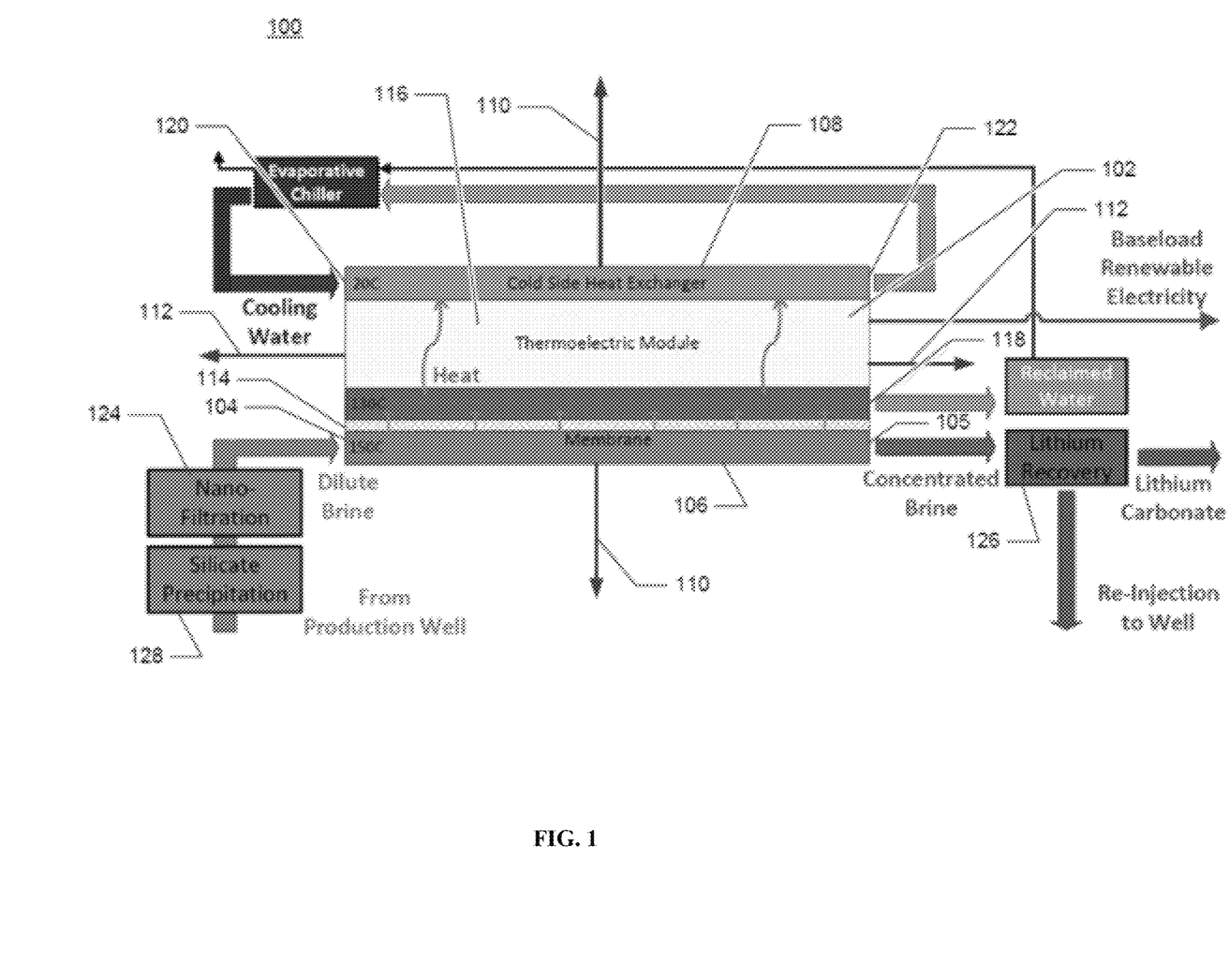
FIG. 1 shows a non-limiting schematic of an apparatus disclosed herein.

The method disclosed herein can be performed by the apparatus disclosed herein. With reference to FIG. 1, disclosed herein is an apparatus 100 comprising a) a housing 102 comprising first inlet 104 and a first outlet 105, wherein the housing 102 comprises a bottom wall 106 and an opposed top wall 108, wherein the bottom wall 106 and the top wall 108 are spaced apart relative to a vertical axis 110, wherein the first inlet 104 and the first outlet 105 are spaced apart relative to a longitudinal axis 112; b) a hydrophobic membrane 114 positioned within the housing 102, wherein the hydrophobic membrane 114 is positioned between the top wall 108 of the housing 102 and both the first inlet 104 and the first outlet 105 relative to the vertical axis 110; and a thermoelectric module 116 positioned within the housing 102, wherein the thermoelectric module 116 is positioned between the top wall 108 and the hydrophobic membrane 114 relative to the vertical axis 110.

Figure 2:
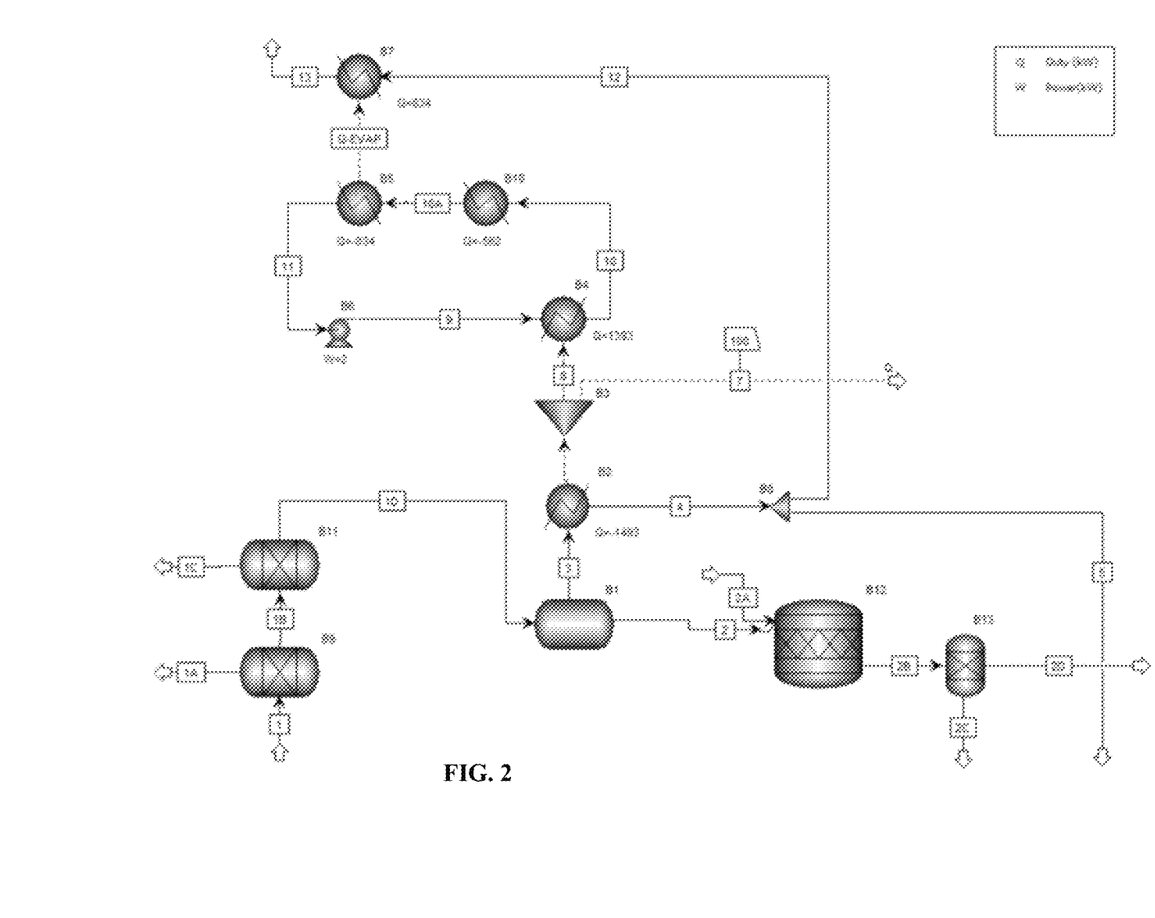
FIG. 2 shows a non-limiting schematic of an apparatus and method including thermodynamic out- and input disclosed herein.
Figure 3A:
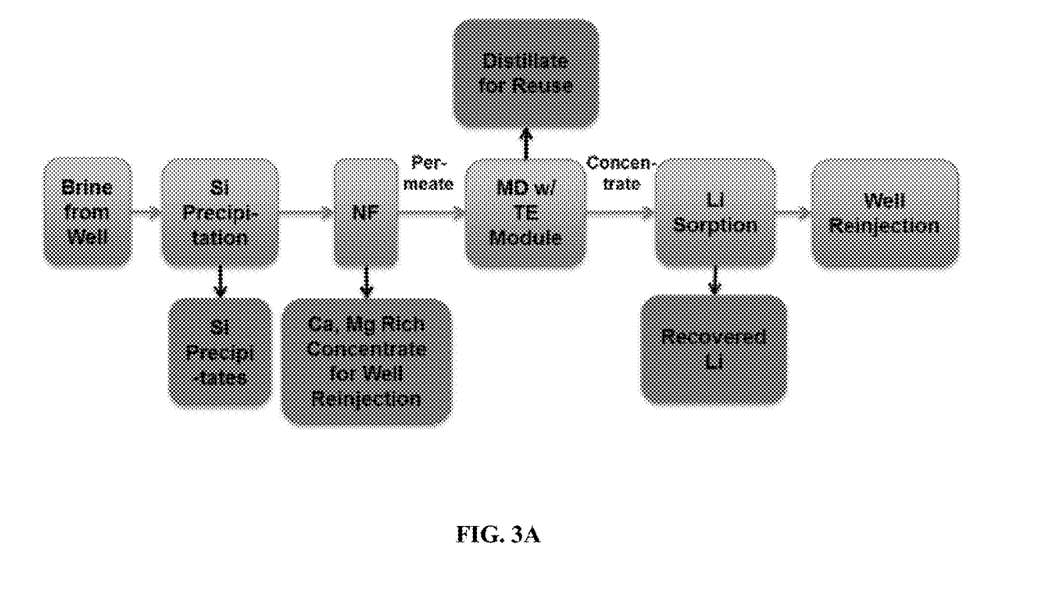
FIGS. 3A and 3B show a non-limiting scheme of a method disclosed herein.
Figure 3B:
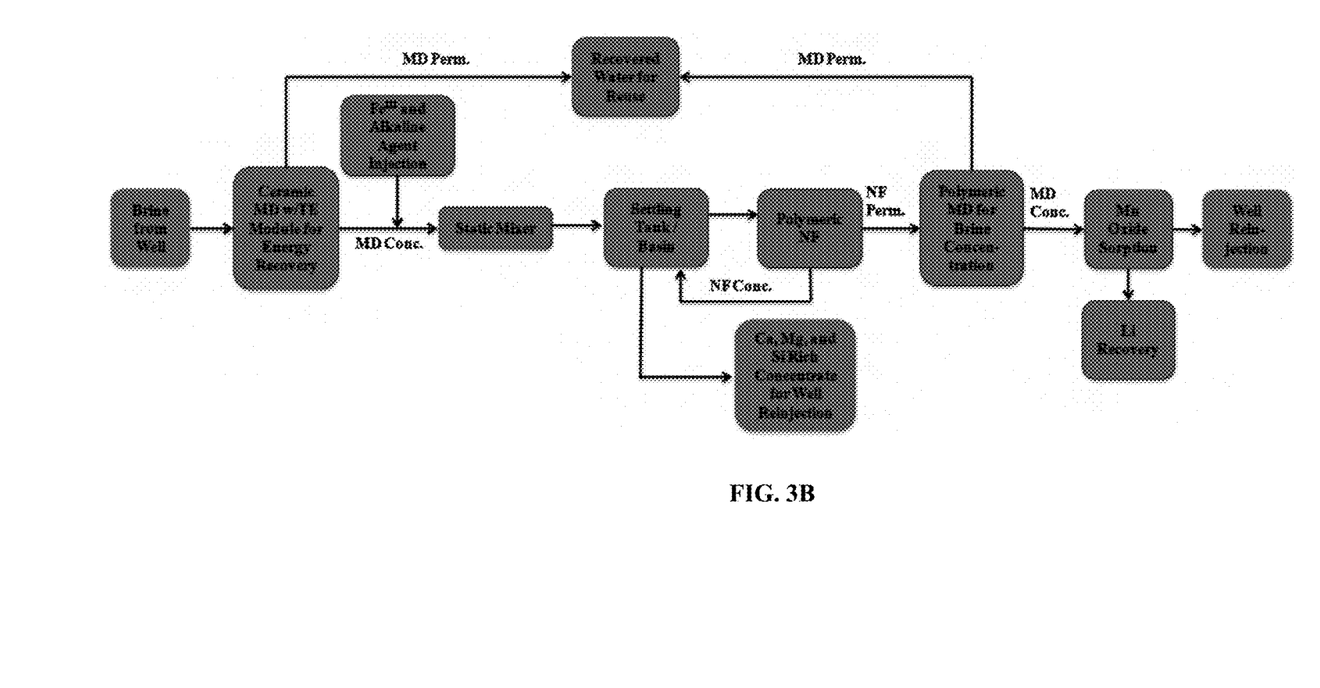

The non-limiting process flow of a method and the thermodynamic input and output disclosed herein is shown FIGS. 2 and 3. FIGS. 1, 2, and 3 shows the same process flow of a method disclosed herein in varying detail.

In one aspect, the housing 102 further comprises a second outlet 118 positioned between the hydrophobic membrane 114 and the thermoelectric module 116 relative to the vertical axis 110.

In one aspect, the housing 102 further comprises a third inlet 120 and a third outlet 122 positioned between the upper wall 108 and the thermoelectric module 116 relative to the vertical axis 110, wherein the housing 102 is configured to transport a coolant into the housing 102 from the third inlet 120 and out from the housing 102 via the third outlet 122.

In one aspect, the housing 102 is configured to transport brine into the housing 102 from the first inlet 104 and brine out of the housing 102 from the first outlet 105.

In one aspect, the housing 102 is in communication with a silica removal unit 128 via the first inlet 104. In another aspect, the housing 102 is in communication with a polyvalent ion removal unit 124 via the first inlet 104. The polyvalent ion removal unit 124 can comprise a nano-filtration membrane. The arrangement of the silica removal unit 128 and the polyvalent ion removal unit 124 can vary relative to the housing 102. In one aspect, the silica removal unit 128 is in communication with the polyvalent ion removal unit 124, which is in communication with the housing 102 via the first inlet 104. In another aspect, the polyvalent ion removal unit 124 is in communication with the silica removal unit 128, which is in communication with the housing 102 via the first inlet 104.

In one aspect, in an apparatus that performs the second method, the silica removal unit is in further communication with an second apparatus (not shown in FIG. 1) comprising a) a housing 102 comprising first inlet 104 and a first outlet 105, wherein the housing 102 comprises a bottom wall 106 and an opposed top wall 108, wherein the bottom wall 106 and the top wall 108 are spaced apart relative to a vertical axis 110, wherein the first inlet 104 and the first outlet 105 are spaced apart relative to a longitudinal axis 112; b) a hydrophobic membrane 114 positioned within the housing 102, wherein the hydrophobic membrane 114 is positioned between the top wall 108 of the housing 102 and both the first inlet 104 and the first outlet 105 relative to the vertical axis 110; and a thermoelectric module 116 positioned within the housing 102, wherein the thermoelectric module 116 is positioned between the top wall 108 and the hydrophobic membrane 114 relative to the vertical axis 110. In this aspect, the apparatus comprises two different housings etc., which is shown in FIG. 3B. In the second apparatus 100, the hydrophobic membrane 114 can be a ceramic hydrophobic membrane. In this configuration, the first brine can be a medium-temperature brine. The temperature of the first brine is lowered by passing water vapor generated from the first brine through a first hydrophobic membrane, thereby producing a fourth brine, wherein the fourth brine is at least about 5% more concentrated in total solids than the first brine. The fourth brine can have a temperature of below about 190° C. or below about 150° C. The fourth brine then enters the silica removal unit 128 and in turn the polyvalent ion removal unit 124 to produce a fifth brine. The fifth brine then enters the first housing 102 (shown in FIG. 1) to separate water vapor from the fifth brine to produce the sixth brine. At least a portion of the one or more minerals is recovered from the sixth brine.

In one aspect, the fourth brine is at least about 10% more concentrated in total solids than the first brine. For example, the fourth brine can be from about 10% to about 15% more concentrated in total solids than the first brine. Total solids in the first brine include, but are not limited to silica and minerals, or a combination thereof.

In one aspect, when step b) or d), depending on the first or second method, removes at least a portion of the silica from the first or fourth brine, thereby producing a second or fifth brine that can comprise precipitating silicates from the first or fourth brine and/or filtering the first or fourth brine. For example, removing at least a portion of the silica from the first or fourth brine, thereby producing a second or fifth brine can comprise precipitating silicates from the first or fourth brine. In another example, removing at least a portion of the silica from the first brine, thereby producing a second or fifth brine can comprise precipitating and filtering silicates from the first or fourth brine. The second or fifth brine has a lower content of silica than the first brine. In one aspect, the second brine has a silica concentration of less than 0.01 wt %, such as, for example, a silica concentration of less than 0.001 wt %. In one aspect, at least 80 wt %, 85 wt %, or 90 wt % of the silica is removed from the first brine. In another aspect, at least 80 wt %, 85 wt %, or 90 wt % of the silica is removed from the second brine. The silica removal unit 128 is a unit that is configured to remove silica from a brine, such as, the first brine, second brine, or fourth brine. The silica can be removed from the first or fourth brine by precipitating silicates from the first or fourth brine in the silica removal unit 128. The silica removal unit 128 can use addition of a caustic material to increase the pH to, for example, about 9, of the brine to precipitate the silica in to the solid phase. In addition, ferric chloride may be added to enhance silica removal. The first bring can subsequently be mechanically filtered to remove additional silica.

In one aspect, the method further comprises adjusting the pH of the first brine to a pH from about 5.0 to about 7.0, such as, for example, a pH from about 5.5 to about 6.5, such as, for example, a pH of about 6.0.

In one aspect, the method further comprises before step c) or in step d), depending on the first or second method, a step comprising removing at least a portion of the one or more polyvalent ions present in the first brine, second brine, or fourth brine. For example, the method can further comprise before step c) a step comprising removing at least a portion of the one or more polyvalent ions present in the first brine. In another example, the method a step d) comprising removing at least a portion of the one or more polyvalent ions present in the fourth brine. In another aspect, the method can further comprise before step c) a step comprising removing at least a portion of the one or more polyvalent ions present in the second brine. The one or more polyvalent ions can comprise Co', Ni', or polyvalent rare earth elements, or a combination thereof. The polyvalent ion removal unit 124 can comprise a nano-filtration membrane, which is configured to remove polyvalent ions from a brine, such as, the first brine, second brine, or fourth brine. As such, the step of removing at least a portion of the one or more polyvalent ions present in the first brine, second brine, or fourth brine can comprise filtering the first, second, or fourth brine through a nano-filtration membrane. Nano-filtration is known in the art and is a membrane filtration-based method that uses nanometer sized pores, generally having pore sizes from 1-10 nanometers. Nano-filtration membranes can be made from polymer thin films, such as, for example, polyethylene terephthalate. The one or more polyvalent ions can comprise $Ca^{2+}$ and $Mg^{2+}$. In one aspect, at least 85 wt %, 90 wt %, or 95 wt % of the one or more polyvalent ions in the first brine is removed. In another aspect, at least 85 wt %, 90 wt %, or 95 wt % of the one or more polyvalent ions in the second brine is removed. In another aspect, at least 85 wt %, 90 wt %, or 95 wt % of the one or more polyvalent ions in the fourth brine is removed. The precipitation and separation of silica and the one or more polyvalent ions removes components that can cause scaling and/or fouling in the hydrophobic membrane/apparatus and interfere with the downstream high-value mineral extraction process.

In one aspect, the method can further comprise recovering at least a portion of the polyvalent ion from the second or fourth brine, wherein the polyvalent ion comprises Co' or Ni', or a combination thereof. The recovering of the polyvalent ion can comprise mixing an ionic liquid with the second or fourth brine.

In one aspect, the first brine has a temperature below about 300° C. In one aspect, the first brine has a temperature below or equal to about 190° C. In another aspect, the first brine has a temperature below or equal to about 180° C. In yet another aspect, the first brine has a temperature below or equal to about 170° C. In yet another aspect, the first brine has a temperature below or equal to about 160° C. In yet another aspect, the first brine has a temperature below or equal about 150° C. In yet another aspect, the first brine has a temperature from about 90° C. to about 190° C. In yet another aspect, the first brine has a temperature from about 90° C. to about 150° C. In yet another aspect, the first brine has a temperature from about 150° C. to about 190° C.

The second or fifth brine enters the apparatus 100 via the first inlet 104. The first, second, and fifth brine can be a low-temperature brine, with a temperature below or equal to about 190° C. or below or equal to about 150° C. The first, second, and fifth brine can be a low-temperature brine, with a temperature below from about 90° C. to about 190° C. or about 90° C. to about 150° C. The first brine can originate from a variety of geothermal or waste water sources. For example, first brine can originate from a low-temperature reservoir found in the vicinity of a tectonic plate line. The location of tectonic plate lines are known to those skilled in the art. Tectonic plate lines can be found, in for example, southern California, Nevada, Chile, Bolivia, China, Tibet, Eastern Africa, and Afghanistan.

The first brine comprises water, silica, one or more polyvalent ions, and at least one mineral. The first brine can comprise less than about 5 wt % of solids, such as, less than about 5 wt % of silica, one or more polyvalent ions, and at least one mineral. In one aspect, the first brine comprises less than 0.1 wt % of the at least one mineral. In another aspect, the first brine can comprise from about 0.01 wt % to about 0.1 wt % of the al least one mineral. The first brine can further comprise rare earth elements, such as, one or more of the fifteen lanthanides in the periodic table, as well as scandium and yttrium.

In one aspect, the at least one mineral comprises lithium, zinc, magnesium, cobalt, nickel, or uranium, or a combination thereof. For example, the at least one mineral can comprise lithium. In another example, the at least one mineral can comprise zinc. In yet another example, at least one mineral can comprise magnesium. In yet another example, at least one mineral can comprise uranium. In yet another example, at least one mineral can comprise a combination of lithium, zinc, magnesium, and uranium. In yet another example, at least one mineral can comprise cobalt or nickel, or a combination thereof.

In one aspect, the first brine comprises less than 0.1 wt % of lithium, zinc, magnesium, or uranium, or a combination thereof. For example, the first brine can comprise less than 0.1 wt % of lithium. In yet another example, the first brine can comprise from about 0.01 wt % to about 0.1 wt % of lithium.

The first brine exits the well under pressure. In one aspect, the first brine is under a pressure from about 1 bar to about 5 bar, such as, for example a pressure from about 3 bar to about 5 bar.

The hydrophobic membrane 114 allows water vapor to pass through, while rejecting liquid water and dissolved solids such as, for example, the at least one mineral or the one or more polyvalent ions, or a combination thereof. In one aspect, the hydrophobic membrane is a ceramic hydrophobic membrane, which has ceramic hollow microfibers. Ceramic hydrophobic membranes are resistant to high temperatures and, thus, are suitable to use with brines, such as a first brine, at temperatures above about 150° C., above about 175° C., or above about 200° C. Ceramic hydrophobic membranes are used to produce a fourth brine from a first brine, wherein the fourth brine is at least 5% more concentrated in total solids than the first brine. In one aspect, the fourth brine is from about 10% to about 20% more concentrated in total solids than the first brine.

In another aspect, the hydrophobic membrane is a polymeric hydrophobic membrane. Polymeric hydrophobic membranes are not as temperature resistant as a ceramic hydrophobic membrane. However, the polymeric hydrophobic membrane has smaller pores than the ceramic hydrophobic membrane, which allows for a higher degree of separation of water vapor and solids. Thus, a polymeric hydrophobic membrane is suitable with brines, such as a second or fifth brine, at temperatures below about 150° C. In such an example when the second brine has a temperature below about 150° C.

The temperature and pressure of the second or fifth brine allows for a significant amount of water vapor to be generated, which passes through the hydrophobic membrane 114. Extraction of water vapor from liquid water streams through use of hydrophobic membranes in thermally driven membrane distillation is well known in the art. The polymeric hydrophobic membrane can be constructed of polyvinylidene fluoride (PVDF). Suitable hydrophobic membranes are commercially available. The mineral content of the third brine is higher than in the second brine. Similarly the mineral content of the sixth brine is higher than in the fifth brine. In one aspect, the concentration of the at least one mineral in the third or sixth brine is from about 0.01 wt % to about 0.5 wt %. In another aspect, the concentration of the at least one mineral in the third or sixth brine is from about 0.02 wt % to about 0.3 wt %. The increase in concentration of minerals in the third or sixth brine enhances the activity, and minimizes the amount of sorbent needed, of sorption-based high-value mineral extraction processes.

The water vapor that has passed through the hydrophobic membrane 114 has a lower temperature as compared to the temperature of the second brine. For example, the temperature for the water vapor can be up to about 40° C. lower as compared to the second or fifth brine, such as from about 5° C. to about 40° C. lower as compared to the second or fifth brine. The water vapor then contacts the thermoelectric module 116. The water vapor condenses on the thermoelectric module 116 and latent heat is transferred from the water vapor to the thermoelectric module 116. The thermoelectric module 116 is configured to operate with a hot side of at a temperature from about 100° C. to about 180° C., and a cool side of about 10° C. to about 80° C. In another example, the thermoelectric module 116 is configured to operate with a hot side of at a temperature from about 120° C. to about 180° C., and a cool side of about 10° C. to about 30° C. The cool side of the thermoelectric module 116 is in contact with the coolant that enters the housing 102 via the third inlet 120 and exits the housing 102 via the third outlet 122. As such, the thermoelectric module 116 can be configured to operate at a temperature difference from about 80° C. to about 150° C. For example, the thermoelectric module 116 can be configured to operate at a temperature difference from about 80° C. to about 120° C. In another example, the thermoelectric module 116 can be configured to operate at a temperature difference from about 90° C. to about 130° C.

The hot side of the thermoelectric module 116 can be tailored to have a surface texture or module orientation that encourages condensation of the water vapor and gravity removal of the condensate from the surface, thereby removing any thermal barrier to heat transfer (latent heat) from the water vapor and promote heat flow thorough the thermoelectric module 116. The thermoelectric module 116 can be of any type or design. The thermoelectric module 116 can comprise one or more individual thermoelectric module generators, such as, for example, from 1 to 300 thermoelectric module generators, or from 1 to 50,000. Electricity is generated when heat is transferred from the hot side to the cool side of the thermoelectric module 116.

In one aspect, the electrical power density can be from about 1 W/cm$^2$ to about 8 W/cm$^2$, such as, for example from 3 W/cm$^2$ to about 5 W/cm$^2$. In one aspect, the method generates from about 100 kW to about 50 MW of electricity. The size of the apparatus can determine the electricity output of the method. The thermoelectric module 116 can comprise p- and n-type thermoelectric couples at a desired size. For example, the size can be from 1.0 mm to about 2.0 mm tall and from 1.0 mm to 3 mm square in the side dimension.

The third or sixth brine exits the housing 102 via the first outlet 105 and enters a mineral recovery unit 126. Recovery of minerals, such as, for example, lithium is known in the art. The higher the concentration of minerals in the third or sixth brine the higher efficiency the apparatus 100 will have. Lithium can be recovered by producing lithium carbonate in the mineral recovery unit 126. Furthermore, lithium recovery from a brine is, for example, described in U.S. Pat. No. 8,753,594 to Burba et al., which is hereby incorporated by reference in its entirety, specifically for its disclosure of lithium recover from a brine. Other suitable lithium recovery processes utilizes a spinel-lithiated manganese oxide sorbent.

In one aspect, the method further comprises injecting the third or sixth brine after the removal of the at least one mineral in to the well where the first brine originated from. The reinjection of the third or sixth brine into the well allows for the well to maintain its pressure and integrity for further production of the first brine. In one aspect, the relatively pure water reclaimed after the mineral recover can be used to meet local water demands (irrigation, potable water, etc.).

The apparatus disclosed herein can be made to a desired scale. For example, an industrial size apparatus is disclosed to meet high demands of large well. In another example, a smaller than industrial apparatus is disclosed to meet demands from a smaller well.

Furthermore, every component in this described system is highly modular. While conventional turbo-machinery based systems and apparatuses require large scale to achieve acceptable efficiencies and specific costs, the described system can be deployed at virtually any scale. This aligns well with the large scale range of potential mineral reserves, allowing for the power generation system to be sized to the local resource and local demand.

2. Aspects

In view of the described apparatus and methods and variations thereof, herein below are described certain more particularly described aspects of the inventions. These particularly recited aspects should not however be interpreted to have any limiting effect on any different claims containing different or more general teachings described herein, or that the "particular" aspects are somehow limited in some way other than the inherent meanings of the language and formulas literally used therein.

Aspect 1: A method for generating electricity and recovering a mineral from a brine comprising the steps of:
  a) providing a first brine comprising water, silica, one or more polyvalent ions, and at least one mineral from a well, wherein the first brine has a temperature below about 300° C.;
  b) removing at least a portion of the silica from the first brine, thereby producing a second brine;
  c) removing at least a portion of the water from the second brine by passing water vapor generated from the second brine through a hydrophobic membrane, thereby producing a third brine, wherein the third brine has a higher concentration of the at least one mineral than the second brine;
  d) contacting at least a portion of the water vapor that passed through the hydrophobic membrane with a thermoelectric module, thereby generating electricity; and
  e) recovering at least a portion of the at least one mineral from the third brine.

Aspect 2: The method of aspect 1, wherein the at least one mineral comprises lithium, zinc, magnesium, or uranium, or a combination thereof.

Aspect 3: The method of aspect 1, wherein the at least one mineral comprises lithium.

Aspect 4: The method of any one of aspects 1-3, wherein the concentration of the at least one mineral in the first brine is less than 0.1 wt %.

Aspect 5: The method of any one of aspects 1-4, wherein the first brine is under a pressure from about 1 bar to about 5 bar.

Aspect 6: The method of any one of aspects 1-4, wherein the first brine is under a pressure from about 3 bar to about 5 bar.

Aspect 7: The method of any one of aspects 1-6, wherein the temperature of the first brine is from about 90° C. to about 190° C.

Aspect 8: The method of any one of aspects 1-7, wherein removing at least a portion of the silica from the first brine comprises precipitating silicates from the first brine and filtering the first brine.

Aspect 9: The method of any one of aspects 1-8, wherein the second brine has a silica concentration of less than 0.01 wt %.

Aspect 10: The method of any one of aspects 1-9, wherein removing the at least a portion of the water from the second brine by passing water vapor generated comprises lowering the pressure of the second brine.

Aspect 11: The method of any one of aspects 1-10, wherein the method further comprises before step c) a step comprising removing at least a portion of the one or more polyvalent ions present in the first brine.

Aspect 12: The method of any one of aspects 1-11, wherein liquid water or solids are not passed through the hydrophobic membrane.

Aspect 13: The method of any one of aspects 1-12, wherein the concentration of the at least one mineral in the third brine is from about 0.01 wt % to about 0.5 wt %.

Aspect 14: The method of any one of aspects 1-12, wherein the concentration of the at least one mineral in the third brine is from about 0.02 wt % to about 0.3 wt %.

Aspect 15: The method of any one of aspects 1-14, wherein the thermoelectric module is configured to operate with a hot side of at a temperature from about 100° C. to about 180° C., and a cool side of about 10° C. to about 80° C.

Aspect 16: The method of any one of aspects 1-15, wherein recovering at least a portion of the at least one mineral from the third brine comprises extracting the at least one mineral from the third brine.

Aspect 17: The method of any one of aspects 1-16, wherein the method further comprises injecting the third brine after the removal of the at least one mineral in to the well where the first brine originated from.

Aspect 18: The method of any one of aspects 1-17, wherein the method generates from about 100 kW to about 50 MW of electricity.

Aspect 19: An apparatus comprising:
a) a housing comprising a first inlet and a first outlet, wherein the housing comprises a bottom wall and an opposed top wall, wherein the bottom wall and the top wall are spaced apart relative to a vertical axis, wherein the first inlet and the first outlet are spaced apart relative to a longitudinal axis;
b) a hydrophobic membrane positioned within the housing, wherein the hydrophobic membrane is positioned between the top wall of the housing and both the first inlet and the first outlet relative to the vertical axis; and
c) a thermoelectric module positioned within the housing, wherein the thermoelectric module is positioned between the top wall and the hydrophobic membrane relative to the vertical axis.

Aspect 20: The apparatus of aspect 19, wherein the housing further comprises a second outlet positioned between the hydrophobic membrane and the thermoelectric module relative to the vertical axis.

Aspect 21: The apparatus of aspects 19 or 20, wherein the housing further comprises a third inlet and a third outlet positioned between the upper wall and the thermoelectric module relative to the vertical axis, wherein the housing is configured to transport a coolant into the housing from the third inlet and out from the housing via the third outlet.

Aspect 22: The apparatus of any one of aspects 19-21, wherein the housing is configured to transport brine into the housing from the first inlet and brine out of the housing from the first outlet.

Aspect 23: The apparatus of any one of aspects 19-22, wherein the housing is in communication with a silica removal unit via the first inlet.

Aspect 24: The apparatus of any one of aspects 19-23, wherein the housing is in communication with a mineral recovery unit via the first outlet.

Aspect 25: The apparatus of any one of aspects 19-24, wherein the housing is in communication with a polyvalent ion removal unit via the first inlet.

Aspect 26: The apparatus of any one of aspects 23-25, wherein the silica removal unit is in further communication with an second apparatus comprising:
a) a housing comprising a first inlet and a first outlet, wherein the housing comprises a bottom wall and an opposed top wall, wherein the bottom wall and the top wall are spaced apart relative to a vertical axis, wherein the first inlet and the first outlet are spaced apart relative to a longitudinal axis;
b) a hydrophobic membrane positioned within the housing, wherein the hydrophobic membrane is positioned between the top wall of the housing and both the first inlet and the first outlet relative to the vertical axis; and
c) a thermoelectric module positioned within the housing, wherein the thermoelectric module is positioned between the top wall and the hydrophobic membrane relative to the vertical axis.

Aspect 27: The apparatus of any one of aspects 19-26, wherein the apparatus is of industrial size.

Aspect 28: A method for generating electricity and recovering a mineral from a brine comprising the steps of:

a) providing a first brine comprising water, silica, one or more polyvalent ions, and at least one mineral from a well, wherein the first brine has a temperature below about 300° C.;
b) removing at least a portion of the water from the first brine by passing water vapor generated from the first brine through a first hydrophobic membrane, thereby producing a fourth brine, wherein the fourth brine is at least about 5% more concentrated in total solids than the first brine;
c) contacting at least a portion of the water vapor that passed through the first hydrophobic membrane with a thermoelectric module, thereby generating electricity;
d) removing at least a portion of the silica and removing at least a portion of the one or more polyvalent ions from the fourth brine, thereby producing a fifth brine;
e) removing at least a portion of the water from the fifth brine by passing water vapor generated from the fifth brine through a second hydrophobic membrane, thereby producing a sixth brine, wherein the sixth brine has a higher concentration of the at least one mineral than the fifth brine; and
f) recovering at least a portion of the at least one mineral from the sixth brine.

Aspect 29: The method of aspect 28, wherein the method further comprises contacting at least a portion of the water vapor that was generated from the fifth brine and passed through the second hydrophobic membrane with a thermoelectric module, thereby generating electricity.

Aspect 30: The method of aspects 28 or 29, wherein the first brine has a temperature below about 190° C.

Aspect 31: The method of aspects 28 or 29, wherein the second brine has a temperature below 150° C. in step d).

Aspect 32: The method of any one of aspects 28-31, wherein the first hydrophobic membrane is a ceramic hydrophobic membrane.

Aspect 33: The method of any one of aspects 28-32, wherein the second hydrophobic membrane is a polymeric hydrophobic membrane.

Aspect 34: The method of any one of aspects 28-33, wherein the fourth brine is from about 10% to about 20% more concentrated in total solids than the first brine.

Aspect 35: The method of any one of aspects 28-34, wherein the method further comprises recovering at least a portion of the one or more polyvalent ions that has been removed from the fourth brine, wherein the one or more polyvalent ions comprises Co', Ni', or a polyvalent rare earth metal, or a combination thereof.

Aspect 36: The method of any one of aspects 28-35, wherein the at least one mineral comprises lithium.

3. Examples

A. Prophetic—Conceptual Design of Apparatus and Method

As described above, a non-limiting process described herein is shown in FIGS. 2, 3A, and 3B. FIG. 2 shows the thermodynamic and process flow model for the apparatus disclosed herein. The method precipitates silica with a removal rate of greater than 80 wt %. Once silica is removed nanofiltration (NF) removes polyvalent ions, such as Ca' and Mg', by greater than 85 wt %. The brine is than exposed to a hydrophobic membrane which separates a portion of the water in the brine to increase the total dissolved solids in the brine. The hydrophobic membrane allows for water vapor to permeate, however no liquid water or dissolved solids will permeate. Water vapor permeating the membrane condenses on contact with the colder thermoelectric module, which harnesses the latent heat given off by the water vapor to produce electricity and reject waste heat to an evaporative chilled cooling loop. As water vapor permeates the membrane, the remaining brine is concentrated allowing for high activity and selectivity of the lithium absorption process. In the mineral recovery system, a manganese oxide sorbent is utilized to extract lithium from the mineral rich concentrated geothermal brine effluent, which is then regenerated to produce stable lithium carbonate. Greater than 30 wt % of the overall brine composition, lithium absorption in which the sorbent capacity is greater than 40 mg lithium/g sorbent can be used to separate lithium from the brine, and the thermoelectric conversion can have an efficiency of greater than 5.5% (such as from 5.5% to about 10.0%) at using a thermoelectric module operating with a temperature gradient of about 100° C.

The composition of the brines through the apparatus shown in FIG. 2 is provided in Table 1. The data was generated by using rigorous thermodynamic and process flow modeling software

TABLE 1

|  | 1 | 1A | 1B | 1C | 1D | 2 | 2A | 2B | 2C | 2D |
|---|---|---|---|---|---|---|---|---|---|---|
| Mole Flow kmol/hr | 0 | 0 | 0 | 0 | 0 | 0 | 0 | 0 | 0 | 0 |
| WATER | 140.369 | 0 | 140.369 | 0 | 140.369 | 7.01843 | 0 | 7.01843 | 7.01843 | 0 |
| CA++ | 0.00129 | 0 | 0.00129 | 0.0011 | 0.00019 | 0.00019 | 0 | 0.00019 | 0.00019 | 0 |
| MG++ | 0.02613 | 0 | 0.02613 | 0.02221 | 0.00392 | 0.00392 | 0 | 0.00392 | 0.00392 | 0 |
| NA+ | 0.84181 | 0 | 0.84181 | 0 | 0.84181 | 0.84181 | 0 | 0.84181 | 0.84181 | 0 |
| CL− | 0.88521 | 0 | 0.88521 | 0 | 0.88521 | 0.88521 | 0 | 0.88521 | 0.88521 | 0 |
| SO4−− | 0.01114 | 0 | 0.01114 | 0 | 0.01114 | 0.01114 | 0 | 0.01114 | 0.01114 | 0 |
| SI4+ | 0.00788 | 0.00709 | 0.00079 | 0 | 0.00079 | 0.00079 | 0 | 0.00079 | 0.00079 | 0 |
| LI+ | 0.01083 | 0 | 0.01083 | 0 | 0.01083 | 0.01083 | 0 | 0 | 0 | 0 |
| CO2 | 0 | 0 | 0 | 0 | 0 | 0 | 0.05 | 0.04459 | 0.04459 | 0 |
| O2 | 0 | 0 | 0 | 0 | 0 | 0 | 0.05 | 0.04729 | 0.04729 | 0 |
| LI2CO3 | 0 | 0 | 0 | 0 | 0 | 0 | 0 | 0.00541 | 0 | 0.00541 |
| Mass Flow kg/hr | 0 | 0 | 0 | 0 | 0 | 0 | 0 | 0 | 0 | 0 |
| WATER | 2528.78 | 0 | 2528.78 | 0 | 2528.78 | 126.439 | 0 | 126.439 | 126.439 | 0 |
| CA++ | 0.05186 | 0 | 0.05186 | 0.04408 | 0.00778 | 0.00778 | 0 | 0.00778 | 0.00778 | 0 |
| MG++ | 0.63507 | 0 | 0.63507 | 0.53981 | 0.09526 | 0.09526 | 0 | 0.09526 | 0.09526 | 0 |
| NA+ | 19.3526 | 0 | 19.3526 | 0 | 19.3526 | 19.3526 | 0 | 19.3526 | 19.3526 | 0 |
| CL− | 31.3837 | 0 | 31.3837 | 0 | 31.3837 | 31.3837 | 0 | 31.3837 | 31.3837 | 0 |
| SO4−− | 1.06991 | 0 | 1.06991 | 0 | 1.06991 | 1.06991 | 0 | 1.06991 | 1.06991 | 0 |
| SI4+ | 0.22127 | 0.19914 | 0.02213 | 0 | 0.02213 | 0.02213 | 0 | 0.02213 | 0.02213 | 0 |
| LI+ | 0.07515 | 0 | 0.07515 | 0 | 0.07515 | 0.07515 | 0 | 0 | 0 | 0 |
| CO2 | 0 | 0 | 0 | 0 | 0 | 0 | 2.20049 | 1.96223 | 1.96223 | 0 |
| O2 | 0 | 0 | 0 | 0 | 0 | 0 | 1.59994 | 1.51332 | 1.51332 | 0 |
| LI2CO3 | 0 | 0 | 0 | 0 | 0 | 0 | 0 | 0.40003 | 0 | 0.40003 |
| Mass Frac | 0 | 0 | 0 | 0 | 0 | 0 | 0 | 0 | 0 | 0 |
| WATER | 0.97955 | 0 | 0.97963 | 0 | 0.97985 | 0.70856 | 0 | 0.69378 | 0.69531 | 0 |
| CA++ | 2E−05 | 0 | 2E−05 | 0.07549 | 3E−06 | 4.4E−05 | 0 | 4.3E−05 | 4.3E−05 | 0 |
| MG++ | 0.00025 | 0 | 0.00025 | 0.92451 | 3.7E−05 | 0.00053 | 0 | 0.00052 | 0.00052 | 0 |
| NA+ | 0.0075 | 0 | 0.0075 | 0 | 0.0075 | 0.10845 | 0 | 0.10619 | 0.10642 | 0 |
| CL− | 0.01216 | 0 | 0.01216 | 0 | 0.01216 | 0.17587 | 0 | 0.17221 | 0.17258 | 0 |
| SO4− | 0.00041 | 0 | 0.00041 | 0 | 0.00041 | 0.006 | 0 | 0.00587 | 0.00588 | 0 |
| SI4+ | 8.6E−05 | 1 | 8.6E−06 | 0 | 8.6E−06 | 0.00012 | 0 | 0.00012 | 0.00012 | 0 |
| LI+ | 2.9E−05 | 0 | 2.9E−05 | 0 | 2.9E−05 | 0.00042 | 0 | 0 | 0 | 0 |
| CO2 | 0 | 0 | 0 | 0 | 0 | 0 | 0.57901 | 0.01077 | 0.01079 | 0 |
| O2 | 0 | 0 | 0 | 0 | 0 | 0 | 0.42099 | 0.0083 | 0.00832 | 0 |
| LI2CO3 | 0 | 0 | 0 | 0 | 0 | 0 | 0 | 0.00219 | 0 | 1 |
| Total Flow kmol/hr | 142.153 | 0.00709 | 142.146 | 0.02331 | 142.122 | 8.77232 | 0.1 | 8.85878 | 8.85337 | 0.00541 |
| Total Flow kg/hr | 2581.57 | 0.19914 | 2581.37 | 0.58389 | 2580.79 | 178.445 | 3.80043 | 182.246 | 181.846 | 0.40003 |
| Temperature C. | 150 | 150 | 150 | 150 | 150 | 150 | 20 | 20 | 20 | 20 |
| Pressure bar | 4.75089 | 4.75089 | 4.75089 | 4.75089 | 4.75089 | 4.75089 | 1 | 1 | 1 | 1 |
| Vapor Frac | 0 | 0 | 0 | 0 | 0 | 0 | 1 | 0.00628 | 0.00629 | 0 |
| Liquid Frac | 0.98745 | 0 | 0.9875 | 0 | 0.98766 | 0.80007 | 0 | 0.79696 | 0.79683 | 1 |
| Density kg/cum | 866.973 | 2326.17 | 866.931 | 927.192 | 866.918 | 920.536 | 1.55925 | 119 | 118.756 | 564.903 |

|  | 3 | 4 | 5 | 9 | 10 |
|---|---|---|---|---|---|
| Mole Flow kmol/hr | 0 | 0 | 0 | 0 | 0 |
| WATER | 133.35 | 133.35 | 56.0071 | 6769.79 | 6769.79 |
| CA++ | 0 | 0 | 0 | 0 | 0 |
| MG++ | 0 | 0 | 0 | 0 | 0 |
| NA+ | 0 | 0 | 0 | 0 | 0 |
| CL− | 0 | 0 | 0 | 0 | 0 |
| SO4−− | 0 | 0 | 0 | 0 | 0 |
| SI4+ | 0 | 0 | 0 | 0 | 0 |
| LI+ | 0 | 0 | 0 | 0 | 0 |
| CO2 | 0 | 0 | 0 | 0 | 0 |
| O2 | 0 | 0 | 0 | 0 | 0 |
| LI2CO3 | 0 | 0 | 0 | 0 | 0 |
| Mass Flow kg/hr | 0 | 0 | 0 | 0 | 0 |
| WATER | 2402.34 | 2402.34 | 1008.98 | 121960 | 121960 |
| CA++ | 0 | 0 | 0 | 0 | 0 |
| MG++ | 0 | 0 | 0 | 0 | 0 |
| NA+ | 0 | 0 | 0 | 0 | 0 |
| CL− | 0 | 0 | 0 | 0 | 0 |

TABLE 1-continued

| | | | | | |
|---|---|---|---|---|---|
| S04-- | 0 | 0 | 0 | 0 | 0 |
| SI4+ | 0 | 0 | 0 | 0 | 0 |
| LI+ | 0 | 0 | 0 | 0 | 0 |
| C02 | 0 | 0 | 0 | 0 | 0 |
| 02 | 0 | 0 | 0 | 0 | 0 |
| LI2C03 | 0 | 0 | 0 | 0 | 0 |
| Mass Frac | 0 | 0 | 0 | 0 | 0 |
| WATER | 1 | 1 | 1 | 1 | 1 |
| CA++ | 0 | 0 | 0 | 0 | 0 |
| MG++ | 0 | 0 | 0 | 0 | 0 |
| NA+ | 0 | 0 | 0 | 0 | 0 |
| CL- | 0 | 0 | 0 | 0 | 0 |
| S04- | 0 | 0 | 0 | 0 | 0 |
| SI4+ | 0 | 0 | 0 | 0 | 0 |
| LI+ | 0 | 0 | 0 | 0 | 0 |
| C02 | 0 | 0 | 0 | 0 | 0 |
| 02 | 0 | 0 | 0 | 0 | 0 |
| LI2C03 | 0 | 0 | 0 | 0 | 0 |
| Total Flow kmol/hr | 133.35 | 133.35 | 56.0071 | 6769.79 | 6769.79 |
| Total Flow kg/hr | 2402.34 | 2402.34 | 1008.98 | 121960 | 121960 |
| Temperature C. | 150 | 125 | 125 | 17.0233 | 27.0287 |
| Pressure bar | 4.75089 | 4.75089 | 4.75089 | 2 | 1.65526 |
| Vapor Frac | 1 | 0 | 0 | 0 | 0 |
| Liquid Frac | 0 | 1 | 1 | 1 | 1 |
| Density kg/cum | 2.43273 | 891.302 | 891.302 | 1001.62 | 991.998 |

| | 10A | 11 | 12 | 13 |
|---|---|---|---|---|
| Mole Flow kmol/hr | 0 | 0 | 0 | 0 |
| WATER | 6769.79 | 6769.79 | 77.3431 | 77.3431 |
| CA++ | 0 | 0 | 0 | 0 |
| MG++ | 0 | 0 | 0 | 0 |
| NA+ | 0 | 0 | 0 | 0 |
| CL- | 0 | 0 | 0 | 0 |
| S04-- | 0 | 0 | 0 | 0 |
| SI4+ | 0 | 0 | 0 | 0 |
| LI+ | 0 | 0 | 0 | 0 |
| C02 | 0 | 0 | 0 | 0 |
| 02 | 0 | 0 | 0 | D |
| LI2C03 | 0 | 0 | 0 | 0 |
| Mass Flow kg/hr | 0 | 0 | 0 | 0 |
| WATER | 121960 | 121960 | 1393.36 | 1393.36 |
| CA++ | 0 | 0 | 0 | 0 |
| MG++ | 0 | 0 | 0 | 0 |
| NA+ | 0 | 0 | 0 | 0 |
| CL- | 0 | 0 | 0 | 0 |
| S04-- | 0 | 0 | 0 | 0 |
| SI4+ | 0 | 0 | 0 | 0 |
| LI+ | 0 | 0 | 0 | 0 |
| C02 | 0 | 0 | 0 | 0 |
| 02 | 0 | 0 | 0 | 0 |
| LI2C03 | 0 | 0 | 0 | 0 |
| Mass Frac | 0 | 0 | 0 | 0 |
| WATER | 1 | 1 | 1 | 1 |
| CA++ | 0 | 0 | 0 | 0 |
| MG++ | 0 | 0 | 0 | 0 |
| NA+ | 0 | 0 | 0 | 0 |
| CL- | 0 | 0 | 0 | 0 |
| S04- | 0 | 0 | 0 | 0 |
| SI4+ | 0 | 0 | 0 | 0 |
| LI+ | 0 | 0 | 0 | 0 |
| C02 | 0 | 0 | 0 | 0 |
| 02 | 0 | 0 | 0 | 0 |
| LI2C03 | 0 | 0 | 0 | 0 |
| Total Flow kmol/hr | 6769.79 | 6769.79 | 77.3431 | 77.3431 |
| Total Flow kg/hr | 121960 | 121960 | 1393.36 | 1393.36 |
| Temperature C. | 23 | 17 | 125 | 150 |
| Pressure bar | 1.48289 | 1.31052 | 4.75089 | 4.75089 |
| Vapor Frac | 0 | 0 | 0 | 0.96086 |
| Liquid Frac | 1 | 1 | 1 | 0.03914 |
| Density kg/cum | 995.884 | 1001.64 | 891.302 | 2.53154 |

B. Experimental Data

Figure 4:
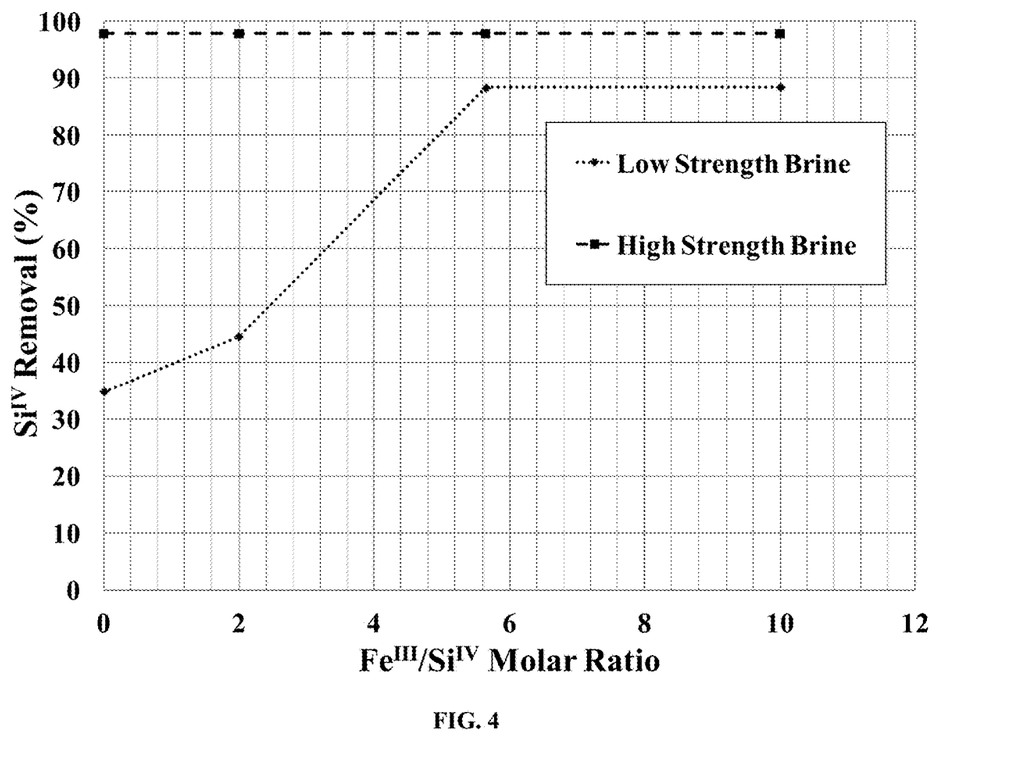
FIG. 4 shows data from a silica removal procedure.

FIG. 4 shows that high $SiO_2$ removal rates can be achieved for high strength brines with only a pH adjustment, while $Fe^{III}$ addition to a $Fe^{III}/Si^{IV}$ molar ratio=5.65 is required to achieve more than 80% $Si^{IV}$ removal for the low strength brine. The initial pH of the brine in this experiment was 6.0-6.2. The high strength brine had a composition as follows—$Ca^{2+}$=425 mg/L, $Cl^-$=13,100 mg/L, $K^+$=630 mg/L, $Mg^{2+}$=245 mg/L, $Na^+$=7,500 mg/L, and $SO_4^{2-}$=448 mg/L. The brine pH was raised and maintained at 9.0. The brine temperature was maintained at 80° C.

Figure 5:
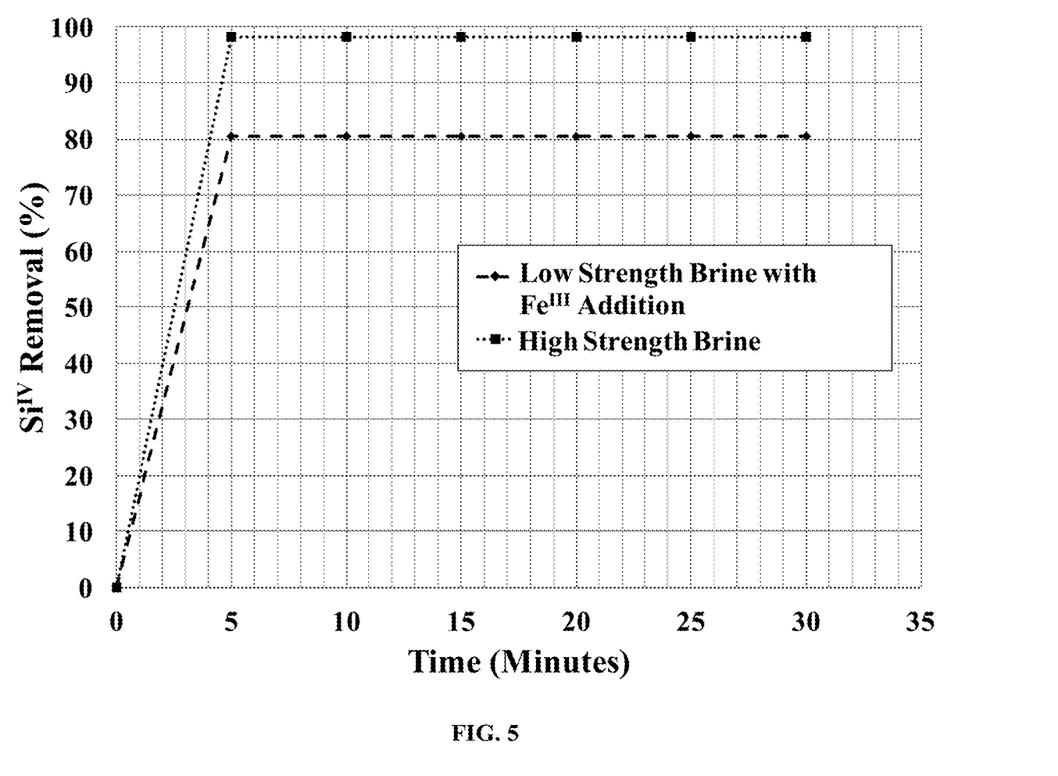
FIG. 5 shows kinetic data from a silica removal procedure.

FIG. 5 shows that the $SiO_2$ precipitation process is rapid with maximum removals achieved with a reaction time of less than 5 minutes. The adjustment of pH combined with $Fe^{III}$ addition and NF will achieve $SiO_2$ removal goals due to the efficacy of the precipitation process and rapid kinetics. In this experiment, the brine pH was increased to 9.0 and the brine temperature was maintained at 80° C. $Fe^{III}$ added to low strength brine at a molar ratio of $Fe^{III}/Si^{IV}$=5.65; No $Fe^{III}$ was added to the high strength brine.

Figure 6:
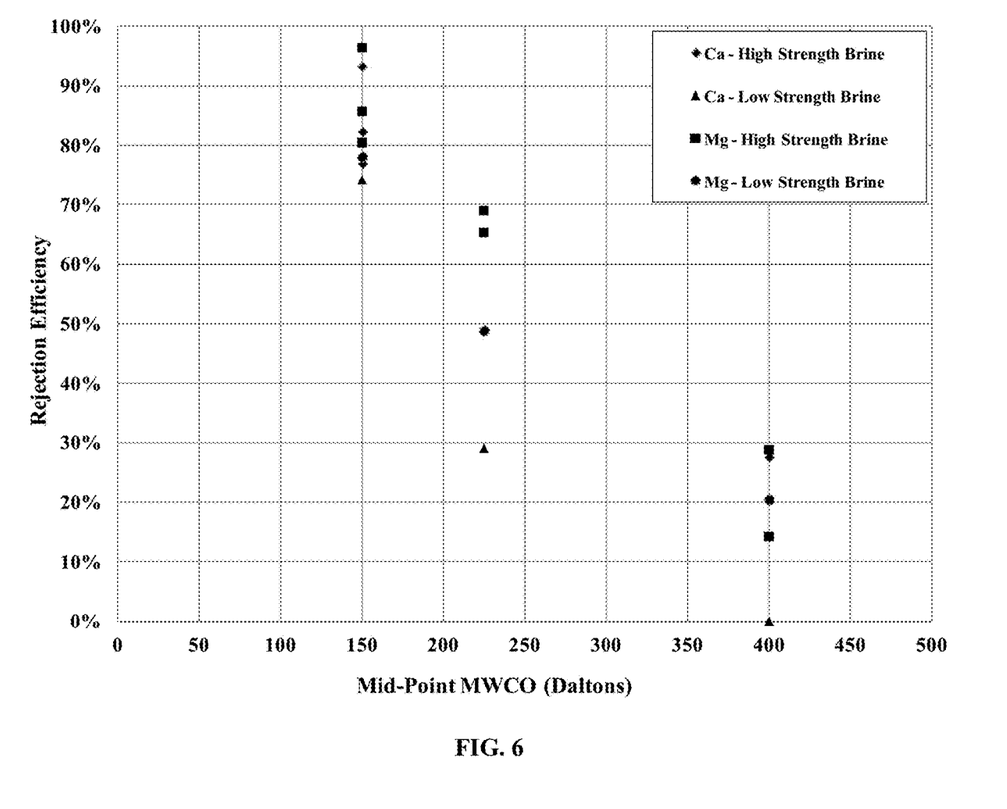
FIG. 6 shows data from nanofiltration experiments.

FIG. 6 shows nanofiltration results for the project utilizing membranes with different molecular weight cut-offs (MW-COs). Table 2 shows the composition of the simulated concentrated brines that were utilized in the nanofiltration experiments. The results indicate that high $Ca^{2+}$ and $Mg^{2+}$ removals can be achieved utilizing nanofiltration membranes with smaller MWCOs (~150).

TABLE 2

| Component | Low Strength Brine (mg/L) | High Strength Brine (mg/L) |
| --- | --- | --- |
| Ca | 22 | 400-460 |
| Cl | 1,800 | 7,000-14,000 |
| Li | 1 | 20-22 |
| Mg | 13 | 60-230 |
| Na | 900 | 3,400-7,000 |
| Si | 2 | 0-12 |
| SO$_4$ | 63 | 380-400 |

What is claimed is:

1. An apparatus comprising:
   a) a housing comprising a first inlet and a first outlet, wherein the housing comprises a bottom wall and an opposed top wall, wherein the bottom wall and the top wall are spaced apart relative to a vertical axis, wherein the first inlet and the first outlet are spaced apart relative to a longitudinal axis;
   b) a hydrophobic membrane positioned within the housing, wherein the hydrophobic membrane is positioned between the top wall of the housing and both the first inlet and the first outlet relative to the vertical axis;
   c) a thermoelectric module positioned within the housing, wherein the thermoelectric module is positioned between the top wall and the hydrophobic membrane and spaced apart from the hydrophobic membrane relative to the vertical axis, and
   d) a conduit positioned between the top wall and the thermoelectric module, wherein the conduit extends between a second inlet and a second outlet spaced apart relative to the longitudinal axis.

2. The apparatus of claim 1, wherein the housing is in communication with a silica removal unit via the first inlet.

3. The apparatus of claim 1, wherein the housing is in communication with a mineral recovery unit via the first outlet.

4. The apparatus of claim 1, wherein the housing is in communication with a polyvalent ion removal unit via the first inlet.

5. The apparatus of claim 1, wherein the hydrophobic membrane is a ceramic hydrophobic membrane.

6. A method for generating electricity and recovering a mineral from a brine comprising the steps of:
   a) providing a first brine comprising water, silica, one or more polyvalent ions, and at least one mineral from a well, wherein the first brine has a temperature below about 300° C.;
   b) removing at least a portion of the water from the first brine by passing water vapor generated from the second brine through a hydrophobic membrane, thereby producing a second brine, wherein the second brine has a higher concentration of the at least one mineral than the first brine; and
   c) contacting at least a portion of the water vapor that passed through the hydrophobic membrane with a thermoelectric module, thereby generating electricity;
   wherein the method is performed in the apparatus of claim 1.

7. The method of claim 6, wherein the method further comprises removing at least a portion of the silica from the first brine prior to step b).

8. The method of claim 6 wherein the method further comprises recovering at least a portion of the at least one mineral from the second brine.

9. The method of claim 6, wherein the at least one mineral comprises lithium, zinc, magnesium, or uranium, or a combination thereof.

10. The method of claim 6, wherein the concentration of the at least one mineral in the first brine is less than 0.1 wt %.

11. The method of claim 6, wherein the temperature of the first brine is from about 90° C. to about 190° C.

12. The method of claim 7, wherein the first brine has a silica concentration of less than 0.01 wt % after the removal of at least the portion of the silica from the first brine.

13. The method of claim 6, wherein the method further comprises before step c) a step comprising removing at least a portion of the one or more polyvalent ions present in the first brine.

14. The method of claim 6, wherein the concentration of the at least one mineral in the second brine is from about 0.02 wt % to about 0.3 wt %.

15. The method of claim 6, wherein the thermoelectric module is configured to operate with a hot side of at a temperature from about 100° C. to about 180° C., and a cool side of about 10° C. to about 80° C.

16. The method of claim 6, wherein recovering at least a portion of the at least one mineral from the second brine comprises extracting the at least one mineral from the second brine.

* * * * *